Sept. 8, 1964 G. C. MESSENGER 3,148,283

VOLTAGE-SENSITIVE CAPACITOR EMPLOYING REVERSE BIASED JUNCTION AND FLOATING CENTER WAFER

Filed June 21, 1960

INVENTOR.
GEORGE C. MESSENGER
BY
Albert L. Free
AGENT 3,148,283

VOLTAGE-SENSITIVE CAPACITOR EMPLOYING REVERSE BIASED JUNCTION AND FLOATING CENTER WAFER

George C. Messenger, Newport Beach, Calif., assignor, by mesne assignments, to Philco Corporation, Philadelphia, Pa., a corporation of Delaware Filed June 21, 1960, Ser. No. 37,678
6 Claims. (Cl. 307—88)

This invention relates to voltage-sensitive capacitors and to circuits for their use.

In many electrical circuits it is desirable to employ a capacitor having a capacity which can be varied by varying the voltage applied across it. For example, such a voltage-sensitive capacitor can be used to provide remote manual electronic tuning of a resonant circuit in a tuned amplifier or oscillator, or to control the frequency of an oscillator in response to an automatic-frequency-control voltage. Other important applications include FM deviators, parametric amplifiers and harmonic generators. It is known to use a semiconductor diode as the voltage-sensitive capacitor in such applications, the diode consisting of one ohmic connection and one rectifying connection to a body of semiconductive material, the rectifying connection being reverse biased and presenting a capacity between the two connections which decreases as the applied reverse voltage is increased.

While such known types of semiconductor diodes have been used successfully in many applications as voltage-sensitive capacitors, they are subject to an important inherent limitation in that they exhibit a high resistance only when the applied voltage between the rectifying and ohmic connections biases the rectifying connection in the reverse direction or very slightly in the forward direction. If in operation the voltage across the diode should become appreciable in the forward direction, the diode will provide a substantially direct short-circuit across the controlled circuit, which in general will either make the circuit completely inoperative or will seriously degrade its performance because of the low-resistance, low Q condition thus produced. When using such a diode as a capacitor in circuits requiring high Q and/or high shunt resistance of the capacitor it is therefore necessary to ensure that under no operating condition of signal and bias applied thereto does the diode become appreciably forward biased, a limitation which restricts the range of control voltage and signal voltage which can safely be utilized in such circuits.

Another problem in such devices, which is of particular importance in high-frequency circuits and in parametric amplifiers designed for use at thousands of megacycles per second, is that of minimizing the effective series resistance of the voltage-sensitive capacitor. This resistance introduces losses which reduce and limit the high-frequency gain of the circuit in which the voltage-sensitive capacitor is used, and for best operation should be made as small as possible.

It is therefore an object of my invention to provide an improved variable-capacitance device of the semiconductor type.

Another object is to provide such a device which has improved resistance characteristics.

Another object is to provide such a device which presents a high resistance in parallel with the capacity thereof for both polarities of applied voltage.

Still another object is to provide such a device which is substantially symmetrical in structure and function.

Another object is to provide a variable-capacity semiconductor device having a low value of effective series resistance, especially at high frequencies.

It is a further object to provide an improved circuit arrangement utilizing a variable-capacitance semiconductor device which operates with either or both polarities of potential applied across it while maintaining a high value of effective parallel resistance and low electrical losses in the device.

In accordance with the invention the above objects are achieved by the provision of a semiconductor device comprising a body of semiconductive material having a pair of rectifying connections thereto, the two connections being similar in having the same polarity of reverse bias with respect to the semiconductive body. Preferably the connections are directly opposite each other on the semiconductive body and are spaced by less than the diffusion length of minority-carriers in the semiconductive material. A variable voltage is applied between the two rectifying connections to vary the capacity of the device, the capacity between the rectifying connections decreasing with increases in the applied voltage of either polarity. With this arrangement one of the rectifying connections is biased in the forward direction while the other is biased in the reverse direction, and under no conditions of voltage are both rectifying connections biased in the forward direction simultaneously. Accordingly the device presents at all times a high resistance in parallel with the voltage-sensitive capacity, regardless of the polarity of the voltage applied to the rectifying connections.

The device may therefore be used in circuits in which substantial voltages of either polarity are applied between the rectifying connections. For example, the device may be connected in parallel with the tank circuit of an oscillator or a tuned amplifier to vary the resonant frequency, and control voltage of a given polarity may be applied between the rectifying connections which is so close to zero that the signal variations in the tuned circuit cause the total voltage between the rectifying connections to assume substantial values of the opposite polarity at the extremes of the signal swing. The device retains its high resistance even under these conditions, and the adverse effects of a sudden high current through the device which would be produced by prior art devices are thereby avoided.

In addition when the two rectifying connections are located in a closely-confronting arrangement on opposite sides of the semiconductor with a spacing between the rectifying barriers which is smaller than a diffusion length for minority carriers in the semiconductor, the effective series resistance of the device is caused by resistance of the forward-biased connection and of the semiconductor, hence the losses in the device at high frequencies, are significantly reduced.

Other objects and features of the invention will be appreciated from a consideration of the following description taken in connection with the accompanying drawings, in which.

Figure 1:
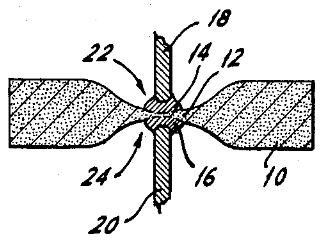
FIGURE 1 is a sectional view of one form of device in accordance with the invention.

Referring now to FIGURE 1, a typical device in accordance with the invention comprises a body of semiconductive material 10 having a region 12 to opposite surfaces of which similar rectifying connections 14 and 16 are provided. Appropriate lead wires 18 and 20 are attached to rectifying connections 14 and 16 respectively, as by soldering. Rectifying connections 14 and 16 are of the area type, such as the surface-barrier contact or the alloy-junction connection, and preferably but not necessarily are substantially identical with each other. The separation between their closely-opposed confronting surfaces is preferably very small, e.g. of the order of a few tenths of a mil or less, in order to reduce the ohmic resistance between them and to permit minority carriers injected by one connection to be collected efficiently by the other connection. The separation between the confronting connections should however be sufficiently large that, when operating voltage is applied between the two leads 18 and 20, punch-through will not occur between the connections.

The manner of construction of the device of FIGURE 1 may be similar to that employed in making the emitter and collector elements of a transistor of the surface-barrier or micro-alloy types, as described respectively in U.S. Patent No. 2,885,571 of R. A. Williams and J. W. Tiley issued May 5, 1959, and U.S. Patent No. 2,870,052 of A. D. Rittmann, issued January 20, 1959. In general this method comprises jet-electrolytically etching the pair of opposed depressions 22 and 24 in the semiconductive body 10 and then jet-electrolytically plating upon the bottoms of these depressions a pair of metal dots which form the rectifying connections 14 and 16 either upon contact or after slight alloying with the semiconductor. In the case of the alloy junction the lead wires 18 and 20 may be soldered to the rectifying connections 14 and 16 during alloying, and at the same time a metal suitable for enhancing the rectifying characteristics of the rectifying connections may be introduced. Since such methods for forming closely-opposed rectifying connections are now well known in the art it is not necessary to describe here in detail the manufacturing steps which may be employed.

In one typical embodiment the semiconductor body 10 was of single-crystalline N-type germanium of about 1 ohm-centimeter resistivity and the rectifying connections were each indium-gallium alloy-junction connections of about 6 mils diameter spaced from each other by about 0.2 mil. In another typical embodiment body 10 was of single-crystalline N-type silicon of about 1 ohm-centimeter resistivity and the rectifying connections were formed by alloying aluminum into the surface of the semiconductor to leave a thickness of semiconductive material of about 0.4 mil between the junctions. In both of these cases the reverse, or high resistance, direction for the rectifying connections occurs when the connection is made negative to the semiconductive body.

Figure 2:
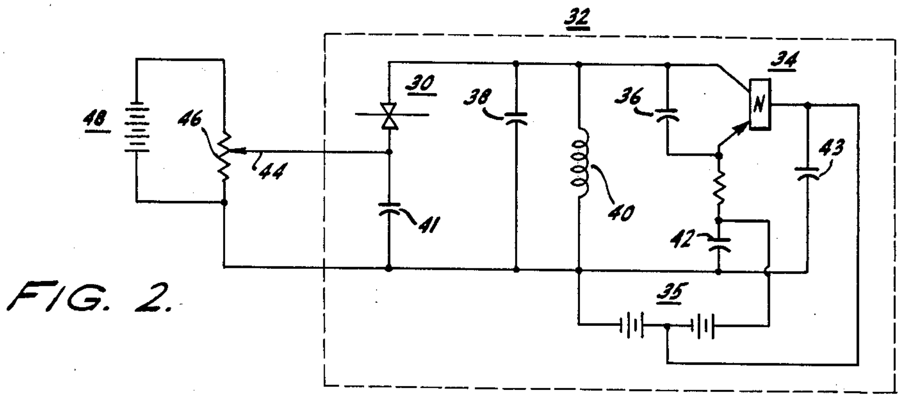
FIGURE 2 is a schematic diagram of one form of apparatus according to the invention.

FIGURE 2 illustrates apparatus in accordance with the invention in which the voltage-sensitive capacitor of FIGURE 1, designated by numeral 30, is utilized to vary the frequency of a transistor oscillator 32. The transistor oscillator 32 may be of a conventional form employing a transistor 34 connected in the common-emitter circuit configuration, with reverse-bias for the collector and forward-bias for the emitter supplied by tapped voltage source 35. Feedback to substain oscillations is provided by capacitor 36 connected between emitter and collector electrodes, and the tank circuit which primarily determines the frequency of oscillation consists of the parallel combination of capacitor 38, inductor 40 and the capacity presented by voltage-sensitive capacitor 30. Capacitor 41 is a blocking capacitor of large value compared with the other capacities in the tank circuit and provides isolation for direct current voltages. Capacitors 42 and 43 provide conventional signal-frequency bypassing.

The voltage applied across voltage-sensitive capacitor 30 is indicated in this instance as supplied from the variable tap 44 on the resistor 46 connected across the potential source 48, the lower connection to capacitor 30 becoming progressively more negative as the tap is moved upwards. With the tap 44 in its lowermost position zero control bias is applied across the voltage-sensitive capacitor 30 and the oscillator frequency of transistor oscillator 32 has its lowest value. As the tap 44 is moved upwards the direct-voltage bias across capacitor 30 increases, the capacity of the element decreases and the frequency of the oscillations increases.

It is noted that the total voltage applied across the voltage-sensitive capacitor 30 is made up of the bias from tap 44 and the signal generated across the tank circuit of the oscillator 32. When the bias supplied from tap 44 is small, the signal voltage across the voltage-sensitive capacitor 30 may cause the upper contact of said capacitor to swing substantially more negative than the lower contact to which arm 44 is connected, during the peaks of the signal swing. However no matter how small the bias, and even if the bias should be reversed, the device 30 will continue to provide a high resistance because under no conditions are both rectifying connections thereof biased in the forward direction. Accordingly the Q of the tank circuit of the oscillator 32 will remain high at all times and the oscillator will continue to operate satisfactorily regardless of the adjustment of the bias across the capacitor 30. In addition the high resistance maintained by this device in both directions of current flow prevents the sudden drawing of a heavy current through the bias-supplying resistor 46, and the consequent abrupt change in the applied bias and in the capacity of device 30, which would be produced by large signal swings if an ordinary diode were employed as the voltage-sensitive capacitor.

Figure 3:
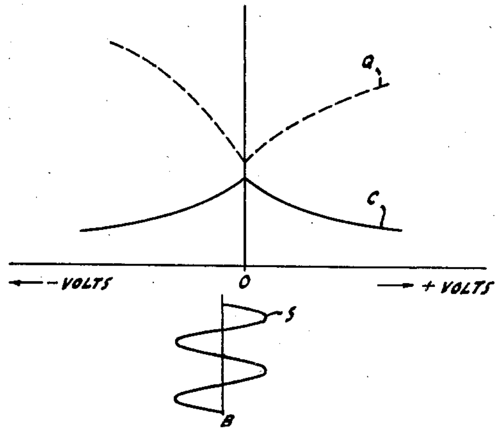
FIGURE 3 is a graphical representation illustrating certain electrical characteristics of the device of FIGURE 1.

The characteristics of the semiconductor capacitor which make possible this operation are illustrated in FIGURE 3, wherein abscissae represent voltages of the lower connection of a voltage-sensitive capacitor 30 with respect to the upper connection thereof, ordinates of the lower solid-line curve C indicate the corresponding values of capacity exhibited by the capacitor 30, and ordinates of the upper dashed-line marked "Q" indicate the Q of the semiconductor capacitor, where Q has the usual meaning of the ratio of the reactance of the capacitor to its total effective series resistance. These characteristics are essentially symmetrical about the zero voltage axis, and show that not only does the capacity decrease substantially with departures of the applied voltage from zero in either direction, but that the Q of the capacitor also remains high regardless of the polarity of the voltage across it. This is because there is no condition of operation in which both of the rectifying connections are biased in the forward direction so as to produce a low resistance through the capacitor, and because the series ohmic losses in the device are kept low by utilizing rectifying connections which are very closely opposed. At zero voltage the Q is somewhat reduced, but still high because each of the rectifying connections individually exhibits a relatively high resistance until a slight forward bias is applied to it.

Because of these characteristics the bias supplied from tap 44 may be adjusted to a value so close to zero, as shown at B in FIGURE 3, that the tips of the signals cause the total voltage to extend into the region of opposite polarity of voltage across the voltage-sensitive capacitor as shown by the sinusoid S, and yet the Q of the capacitor remains high.

Figure 4:
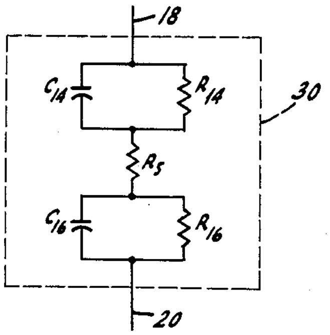
FIGURE 4 is a diagrammatic representation of an equivalent circuit of said device to which reference will be made in explaining the principle of the invention.

The reasons for the extence of high Q for both polarities of bias will be more readily apparent from a consideration of the equivalent-circuit diagram of capacitor 30 shown in FIGURE 4. In this diagram $C_{14}$ represents the capacity between the rectifying connection 14 and the underlying semiconductive material of body 10 and $R_{14}$ represents the effective shunt resistance in parallel with this capacity due to leakage current through the rectifying connection. When rectifying connection 14 is biased in the reverse direction $R_{14}$ is very high and signal transfer occurs substantially only by way of capacitor $C_{14}$. $C_{16}$ and $R_{16}$ represent the corresponding capacity and shunt resistance of the rectifying connection 16, while $R_S$ represents the effective series resistance of the capacitor due to resistance of the forward-biased connection and of the semiconductive material.

Since the only potentials supplied to the semiconductive body are supplied by way of rectifying connections 14 and 16, the semiconductive material between the connections is at all times at a potential intermediate to those applied to the two rectifying connections, so that no matter which polarity of voltage is applied between the rectifying connections one of these connections is biased in the forward direction and the other in the reverse direction with respect to the semiconductive body. For example in the case of an N-type semiconductive body between the rectifying connection, when lead wire 18 is made positive with respect to lead wire 20 rectifying connection 14 is positive with respect to the intermediate semiconductor material and is therefore biased in its forward direction, while rectifying connection 16 is negative with respect to the semiconductor and therefore is biased reversely. Under these conditions rectifying connection 14 serves as a low-resistance connection, the reverse-biased connection 16 provides a high value of the shunt resistance $R_{16}$, while series resistance $R_S$ is low because of the close spacing of the rectifying connections. Hence the total capacity presented between lead wires 18 and 20 is essentially the capacity $C_{16}$ of rectifying connection 16, and the very high shunt resistance $R_{16}$ and the very low series resistance due to $R_{14}$ and $R_S$ produce a low effective series resistance and a corresponding high Q for the capacitor. When the polarity of potential between the lead wires 18 and 20 is reversed the roles of the two rectifying connections are merely reversed, and as a result the symmetrical characteristic shown in FIGURE 3 is obtained.

If the semiconductive body and rectifying connections are constructed so that the polarity of reverse bias of the rectifying connections is reversed, as when the body is of P-type material, the operation of the device is as described above except that the polarities of the voltages applied across the voltage-sensitive capacitor will be reversed, as will be apparent to one skilled in the art.

Referring again to the arrangement of FIGURE 2, it will be understood that the source of the varying control potential for capacitor 30 indicated in the drawing as coming from the battery 43 and variable tap 44 may be any source of control potential, such as the AGC voltage of a radio receiver. In all such cases the range of permissible variation of the control voltage is enlarged by virtue of the fact that it may be permitted to approach zero value as closely as desired or even pass it slightly without producing short-circuiting or abrupt lowering of the Q, despite relatively large swings in the oscillation signals from oscillator 30 which may produce substantial voltages of opposite polarity across the capacitor 30.

The exact magnitude of capacity and capacity variations, as well as the values of Q, obtained in any particular case depend upon the particular dimensions and materials used in the voltage-sensitive capacitor. High values of Q are enhanced by using low-resistance semiconductive material (typically 1 ohm-centimeter or less) and close spacings between the rectifying connections (typically a few tenths of a mil or less). Larger capacities may be obtained by using larger areas of rectifying connections, and larger capacity variations per volt of applied voltage are produced with higher-resistivity materials. For any particular application a suitable compromise between these factors should be made. As an example only, minimum values of Q of the order of 40 have been obtained at frequencies of about 50 megacycles per second, with capacity variations of more than two to one. In any case the back-to-back arrangement of the rectifying connections through which all of the current flows eliminates the possibility of excessive current loading which exists in prior art devices and therefore permits a wider range of variation of the voltage applied to the voltage-sensitive capacitor.

When the voltage-sensitive capacitor described is used as the capacity-variable element of a conventional parametric amplifier, improved gain at high frequencies in the thousands of megacycles per second is obtained. This improvement is believed to be due to the use of a forward-biased minority-carrier injecting connection as the low-resistance connection, in place of the ohmic connection of the prior art, which reduces the effective series resistance $R_S$ which limits gain at these extremely high frequencies.

Figure 5:
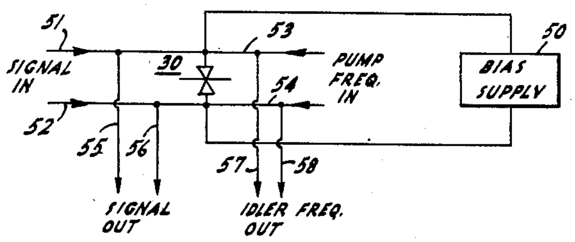
FIGURE 5 is a schematic diagram illustrating one connection of said device in a parametric amplifier.

The connection of my variable-capacitor in a parametric amplifier may be conventional, as represented schematically in FIGURE 5. As there shown the variable-capacitor 30 may be supplied with appropriate bias from bias supply 50, with input signal from leads 51, 52, and with pump signals from leads 53, 54. Amplified output appears between leads 55 and 56, and idler frequency output between leads 57 and 58. It will be understood that for use in the microwave range of frequencies the circuit connections indicated are made by appropriate transmission lines or waveguides in a manner well known in the art.

While the invention has been described with particular reference to specific embodiments thereof it will be understood that it may be embodied in any of a variety of other diverse forms without departing from the spirit of the invention as defined by the appended claims.

I claim:

1. Variable-capacity apparatus comprising a wafer of a semiconductive material of a single conductivity type having two rectifying connections to opposite sides thereof, said connections having the same polarity of reverse bias with respect to said body and at least one of said connections having a capacity which decreases substantially with increases in the reverse bias thereof, and means for applying a varying voltage between said connections to vary substantially the capacity of at least one of said connections, each of said connections constituting the sole source of current for the other whereby said connections are prevented from being forward biased simultaneously despite changes in the polarity of said voltage.

2. Apparatus in accordance with claim 1, in which said rectifying connections are alloy-type connections, closely-opposed to minimize the resistance of the portion of said body which separates them.

3. Apparatus in accordance with claim 1, in which said rectifying connections are spaced from each other by less than a diffusion length for minority-carriers in said semiconductive material, and said varying voltage includes a component in the microwave frequency range.

4. Apparatus in accordance with claim 1, in which said means for applying a varying voltage comprises means for applying a voltage which possesses opposite polarities at different times.

5. Apparatus in accordance with claim 4, in which said body is of single-crystalline silicon and said rectifying connections are alloy-junction connections to opposite, closely-spaced surfaces of said body.

6. Apparatus in accordance with claim 4, in which said body is of single-crystalline germanium.

References Cited in the file of this patent

UNITED STATES PATENTS

| | | |
|---|---|---|
| 2,836,776 | Ishikawa et al. | May 27, 1958 |
| 2,951,207 | Hudspeth | Aug. 30, 1960 |
| 2,970,275 | Kurzrok | Jan. 31, 1961 |
| 2,991,371 | Le Hovec | July 4, 1961 |